(12) United States Patent
Zhao et al.

(10) Patent No.: US 12,399,087 B2
(45) Date of Patent: Aug. 26, 2025

(54) INTEGRATED TESTING PLATFORM AND METHOD FOR POWER BATTERY, ELECTRIC DRIVE SYSTEM AND ELECTRONIC CONTROL SYSTEM OF AN ELECTRIC VEHICLE BASED ON SYNCHRONIZED CONTROL OF FRONT AND REAR MOTORS

(71) Applicant: CHANG'AN UNIVERSITY, Xi'an (CN)

(72) Inventors: Xuan Zhao, Xi'an (CN); Jian Ma, Xi'an (CN); Dean Meng, Xi'an (CN); Xiaolei Yuan, Xi'an (CN); Kai Zhang, Xi'an (CN); Shu Wang, Xi'an (CN); Peilong Shi, Xi'an (CN); Xianwu Gong, Xi'an (CN); Qifan Xue, Xi'an (CN)

(73) Assignee: CHANG'AN UNIVERSITY, Xi'an (CN)

( * ) Notice: Subject to any disclaimer, the term of this patent is extended or adjusted under 35 U.S.C. 154(b) by 0 days.

(21) Appl. No.: 19/031,754

(22) Filed: Jan. 18, 2025

(65) Prior Publication Data
US 2025/0164350 A1    May 22, 2025

Related U.S. Application Data

(63) Continuation of application No. PCT/CN2024/113435, filed on Aug. 20, 2024.

(30) Foreign Application Priority Data

Nov. 28, 2023  (CN) .......................... 202311603880.7

(51) Int. Cl.
*G01R 31/396*    (2019.01)
*G01M 17/007*    (2006.01)
(Continued)

(52) U.S. Cl.
CPC ....... *G01M 17/0074* (2013.01); *G01R 31/374* (2019.01); *G01R 31/3842* (2019.01); *G01R 31/396* (2019.01)

(58) Field of Classification Search
CPC ........... G01M 17/0074; G01M 17/007; G01M 17/013; G01M 13/026; G01M 17/0072;
(Continued)

(56) References Cited

U.S. PATENT DOCUMENTS

2003/0158638 A1    8/2003  Yakes et al.

FOREIGN PATENT DOCUMENTS

| CN | 103226067 A | 7/2013 |
| CN | 105181347 A | 12/2015 |

(Continued)

*Primary Examiner* — Catherine T. Rastovski
*Assistant Examiner* — Sharad Timilsina

(57) ABSTRACT

An integrated testing platform for power battery, electric drive system and electronic control system of an electric vehicle based on synchronized control of front and rear motors, including a first testing unit, a second testing unit, a third testing unit, a fourth testing unit and a wheelbase adjustment device. The first and second testing units are structurally identical, each including a first driving roller mechanism, a first driven roller mechanism, a first lifting device and a first motor. The third and fourth testing units are structurally identical, each including a second driving roller mechanism, a second driven roller mechanism, a second lifting device, a blocking device, a locking mechanism and a second motor. The wheelbase adjustment device is configured to adjust a distance between a base of the first motor and a frame assembly. The first motor and the second motor are synchronously controlled during testing.

8 Claims, 16 Drawing Sheets

(51) Int. Cl.
　　　　*G01R 31/374*　　　(2019.01)
　　　　*G01R 31/3842*　　(2019.01)
(58) Field of Classification Search
　　　　CPC ............. G01M 17/045; G01M 13/027; G01M 13/025; G01M 17/0076; G01M 17/02; G01M 17/022; G01R 31/396; G01R 31/3842; G01R 31/374
　　　　See application file for complete search history.

(56) References Cited

FOREIGN PATENT DOCUMENTS

| | | | | |
|---|---|---|---|---|
| CN | 107436243 A | * | 12/2017 | .......... G01M 17/007 |
| CN | 107764568 A | * | 3/2018 | ............... G01L 3/24 |
| CN | 112082776 A | | 12/2020 | |
| CN | 113188808 A | | 7/2021 | |
| CN | 214121607 U | | 9/2021 | |
| CN | 115060506 A | | 9/2022 | |
| CN | 217586316 U | | 10/2022 | |
| CN | 117629656 A | | 3/2024 | |
| JP | 2002340743 A | | 11/2002 | |
| JP | 2013160746 A | * | 8/2013 | |
| WO | 2010047197 A1 | | 4/2010 | |
| WO | 2022059387 A1 | | 3/2022 | |

\* cited by examiner

INTEGRATED TESTING PLATFORM AND METHOD FOR POWER BATTERY, ELECTRIC DRIVE SYSTEM AND ELECTRONIC CONTROL SYSTEM OF AN ELECTRIC VEHICLE BASED ON SYNCHRONIZED CONTROL OF FRONT AND REAR MOTORS

CROSS-REFERENCE TO RELATED APPLICATIONS

This application is a continuation of International Patent Application No. PCT/CN2024/113435, filed on Aug. 20, 2024, which claims the benefit of priority from Chinese Patent Application No. 202311603880.7, filed on Nov. 28, 2023. The content of the aforementioned application, including any intervening amendments made thereto, is incorporated herein by reference in its entirety.

TECHNICAL FIELD

This application relates to electric vehicle testing, and more particularly to an integrated testing platform and method for power battery, electric drive system and electronic control system of an electric vehicle based on synchronized control of front and rear motors.

BACKGROUND

Electric vehicles, as a clean energy mode of transportation, are gradually gaining widespread attention. Their core components include the power battery, electric drive system and electronic control system. To ensure the performance and safety of the electric vehicles, accurate testing and evaluation of these core components have become crucial.

However, the field of electric vehicle testing still faces a range of challenges. Firstly, the primary issue lies in the unique characteristics and demands of different types of drive systems. Particularly under conditions of rapid change, such as sudden acceleration or abrupt braking, the power output of the testing bench often struggles to fully meet the actual needs of electric vehicles. This can lead to the electronic stability program (ESP) system misjudging vehicle stability and triggering alarms, presenting a significant challenge to the high-precision synchronization control of the testing equipment. Secondly, the power battery, as the energy source for electric vehicles, requires accurate measurement of critical parameters such as voltage, current, temperature, and state of charge (SOC). Thirdly, in view of the specific requirements for testing the power performance and economic efficiency of in-use electric vehicles, a dedicated integrated testing station for the three systems (the power battery, electric drive system and electronic control system) must be established. At this station, the overall power performance and economic efficiency of the electric vehicle will be comprehensively assessed, providing an integrated evaluation of the performance status of its battery system, electric drive system, and electronic control system.

SUMMARY

In view of the problems in the prior art, this application provides an integrated testing platform for power battery, electric drive system and electronic control system of an electric vehicle based on synchronized control of front and rear motors, which enables synchronous control of the front and rear motors, thereby comprehensively assessing the overall dynamic performance and economic performance of the electric vehicle under corresponding test conditions, and further evaluating the performance status of the electric vehicle's battery system, electric drive system, and electronic control system.

To achieve the above objectives, the present disclosure provides the following technical solutions.

An integrated testing platform for power battery, electric drive system and electronic control system of an electric vehicle based on synchronized control of front and rear motors, comprising:
a first testing unit;
a second testing unit;
a third testing unit;
a fourth testing unit; and
a wheelbase adjustment device;
wherein the first testing unit is configured to test a first front wheel of the electric vehicle; the second testing unit is configured to test a second front wheel of the electric vehicle; the third testing unit is configured to test a first rear wheel of the electric vehicle; and the fourth testing unit is configured to test a second rear wheel of the electric vehicle; the first testing unit is structurally identical to the second testing unit; the third testing unit is structurally identical to the fourth testing unit; the first testing unit, the second testing unit, the third testing unit and the fourth testing unit are provided at the same horizontal foundation plane;
a transverse centerline of the first testing unit coincides with a transverse centerline of the second testing unit; a transverse centerline of the third testing unit coincides with a transverse centerline of the fourth testing unit; the wheelbase adjustment device is provided between the third testing unit and the fourth testing unit; and a transverse centerline of the wheelbase adjustment device coincides with the transverse centerline of the third testing unit and the transverse centerline of the fourth testing unit;
each of the first testing unit and the second testing unit comprises a first driving roller mechanism, a first driven roller mechanism, a first lifting device and a first motor; the first driving roller mechanism and the first driven roller mechanism are configured to keep synchronized in motion state; the first driving roller mechanism is connected to the first motor, and is configured to be driven by the first motor; the first lifting device is configured to lift and lower the first driving roller mechanism and the first driven roller mechanism; the first testing unit and the second testing unit are each provided on a base of the first motor; the base of the first motor is provided on a rail assembly; and the rail assembly comprises a lateral rail and a longitudinal rail;
each of the third testing unit and the fourth testing unit comprises a second driving roller mechanism, a second driven roller mechanism, a second lifting device, a blocking device, a locking mechanism and a second motor; the second driving roller mechanism and the second driven roller mechanism are configured to keep synchronized in motion state; the second driving roller mechanism is connected to the second motor, and is configured to be driven by the second motor; the second lifting device is configured to lift and lower the second driving roller mechanism and the second driven roller mechanism; the blocking device is configured to prevent the first rear wheel and the second rear wheel from exiting a testing position during a testing process;

the locking mechanism is configured to lock the second driving roller mechanism and the second driven roller mechanism; the locking mechanism is connected to the second lifting device through a first linkage mechanism; the third testing unit and the fourth testing unit are each provided on a frame assembly; a bottom of the frame assembly is provided on a rear rail; and the rear rail is linked with the rail assembly;

the wheelbase adjustment device is configured to adjust a distance between the base of the first motor and the frame assembly;

the first motor and the second motor are configured to be synchronously controlled by a controller during the testing process;

the first driving roller mechanism is structurally identical to the first driven roller mechanism; a first end of the first driving roller mechanism is connected to a first end of the first driven roller mechanism through a first belt, such that the first driving roller mechanism and the first driven roller mechanism are synchronized in the motion state; a second end of the first driving roller mechanism is provided with a first gear; a side of the first motor is provided with a second gear; the first gear is connected to the second gear through a second belt, such that the first driving roller mechanism is driven by the first motor; the first lifting device is provided at a center between the first driving roller mechanism and the first driven roller mechanism; a lower end of the first lifting device is connected to a first air pump through a second linkage mechanism; the first air pump is fixed on the base of the first motor; the first air pump is parallel to an edge of the base of the first motor; the lateral rail is perpendicular to the longitudinal rail; and the longitudinal rail is provided below the lateral rail; and the first driving roller mechanism has a symmetrical structure, and comprises a first cylindrical roller, a bearing, a first bearing seat and the first gear; the bearing is provided along a central axis of the first cylindrical roller; a side of the bearing is configured to fit a side of the first cylindrical roller; a side of the first bearing seat is configured to fit a side of the first gear; centers of the first bearing seat and the first gear are located at the central axis of the first cylindrical roller; and two opposite sides of the first cylindrical roller are each provided with the bearing, the first bearing seat and the first gear through the same mounting manner.

In an embodiment, the first testing unit and the second testing unit each further comprise the first air pump; the first air pump is fixed on the base of the first motor through a first base frame; and the first lifting device is connected to an upper end of the first air pump via the second linkage mechanism, and is configured to be driven by the first air pump to move up and down; and each of the third testing unit and the fourth testing unit further comprises a second air pump; the second air pump comprises a pump body, a second base frame and a third linkage mechanism; a lower end of the pump body is connected to the second base frame; the second base frame is boltedly fixed to the frame assembly; and the pump body is connected to the second lifting device via the third linkage mechanism, and is configured to drive the second lifting device to ascend and descend.

In an embodiment, the lateral rail comprises two first rail segments; the two first rail segments are structurally identical, and are symmetrically provided on both sides of the base of the first motor; each of the two first rail segments is symmetrically provided with two first fasteners; a top end of each of the two first rail segments is provided with a first baffle for blocking;

the longitudinal rail comprises two second rail segments; the two second rail segments are structurally identical; each of the two second rail segments is symmetrically provided with two second fasteners; and a top end of each of the two second rail segments is provided with a second baffle for blocking; and the rear rail comprises a third fastener, a third baffle, and a third rail segment; two ends of a base frame of the rear rail are each fixedly provided with the third fastener to drive the third testing unit and the fourth testing unit to move along the rear rail; and two ends of the third rail segment are each fixedly provided with the third baffle.

In an embodiment, the frame assembly comprises:

a lower frame;

a middle frame; and an upper frame;

wherein each of the third testing unit and the fourth testing unit further comprises a second air pump; the rear rail is fixed to the lower frame; the second air pump is fixed at a middle of the middle frame, and is connected to the second lifting device via a third linkage mechanism; the second motor is fixed to a side of the middle frame; the second motor is provided with a third gear; two sides of the second driving roller mechanism are respectively provided with a fourth gear and a fifth gear; the third gear is connected to the fourth gear via a third belt; two sides of the second driven roller mechanism are respectively provided with a sixth gear and a seventh gear; the fourth gear and the fifth gear are each fixed to the upper frame through a second bearing seat; the sixth gear and the seventh gear are each fixed to the upper frame through a third bearing seat; the fifth gear is connected to the sixth gear via a fourth belt for transmission;

the second lifting device is provided between the second driving roller mechanism and the second driven roller mechanism; a side of the second driving roller mechanism away from the second driven roller mechanism and a side of the second driven roller mechanism away from the second driving roller mechanism are each provided with the blocking device; the locking mechanism is boltedly fixed to the upper frame; and the locking mechanism is provided on both sides of the air pump, and is connected to the second lifting device via the first linkage mechanism.

In an embodiment, the second driving roller mechanism comprises:

a second cylindrical roller;

two second bearing seats;

the fourth gear; and the fifth gear;

wherein a central axis of each of the two second bearing seats coincides with a central axis of the second cylindrical roller; the two second bearing seats are symmetrically provided on both sides of the second cylindrical roller; side surfaces of the two second bearing seats are respectively configured to fit a side of the fourth gear and a side of the fifth gear; a central axis of the fourth gear and a central axis of the fifth gear coincide with the central axis of the second cylindrical roller; the second driving roller mechanism has a symmetrical structure; the fourth gear and the fifth gear are symmetrically provided on both sides of the second cylindrical roller; and the second driven roller mechanism is structurally identical to the second driving roller mechanism; the second driving roller mechanism and the second driven roller mechanism are structurally identical.

In an embodiment, the blocking device comprises:
a second cylindrical roller;
two fourth bearing seats; and
a spring;
wherein the two fourth bearing seats are symmetrically arranged on both sides of the second cylindrical roller; a center of each of the two fourth bearing seats is located on a center axis of the second cylindrical roller; a lower end of each of the two fourth bearing seats is boltedly fixed to a support plate; a lower surface of the support plate is connected to a first end of the spring; and a second end of the spring is fixed to the frame assembly.

In an embodiment, the wheelbase adjustment device comprises:
a third motor;
an intermediate shaft;
a coupling;
a protective cover;
a screw rod; and
two supports;
wherein an upper end of one of the two supports is fixed to a lower side of a base frame of the third testing unit; an upper end of the other of the two supports is fixed to a lower side of a base frame of the fourth testing unit; a center of each of the two supports is provided with a circular opening; the screw rod is configured to pass through the circular opening; the protective cover is configured to cover a part of the screw rod between a first end of the screw rod and one of the two supports and a part of the screw rod between a second end of the screw rod and the other of the two supports; the first end and the second end of the screw rod are each boltedly fixed to the coupling; the intermediate shaft is boltedly fixed to an end of the coupling; and an end of the intermediate shaft is boltedly fixed to the third motor.

A testing method using the integrated testing platform, comprising:
before testing, moving, by the wheelbase adjustment device, the frame assembly supporting the third testing unit and the fourth testing unit forward or backward along the rear rail based on a wheelbase of a to-be-tested electric vehicle to allow a distance between the first testing unit and the third testing unit and a distance between the second testing unit and the fourth testing unit to match the wheelbase of the to-be-tested electric vehicle; raising the first lifting device and the second lifting device such that an upper end of each of the first lifting device and the second lifting device is flush with a ground; lowering the blocking device to align with a height of each of the second driving roller mechanism and the second driven roller mechanism; driving the to-be-tested electric vehicle to the integrated testing platform; raising the blocking device to prevent the first rear wheel and the second rear wheel from exiting the testing position during the testing process; and lowing the first lifting device and the second lifting device to allow the first front wheel, the second front wheel, the first rear wheel and the second rear wheel to be respectively suspended between the first driving roller mechanism and the first driven roller mechanism of the first testing unit, between the first driving roller mechanism and the first driven roller mechanism of the second testing unit, between the second driving roller mechanism and the second driven roller mechanism of the third testing unit, and between the second driving roller mechanism and the second driven roller mechanism of the fourth testing unit; and during the testing process, synchronously controlling the first motor and the second motor using a proportional-integral-derivative (PID) control algorithm; simulating loads under road driving conditions according to a performance testing requirement of the to-be-tested electric vehicle; and measuring a voltage, a current, and a temperature of individual cells within a power battery pack of the to-be-tested electric vehicle, as well as a state-of-charge (SOC) value of the power battery pack to evaluate a performance state of a power battery, an electric drive system and an electronic control system of the to-be-tested electric vehicle.

Compared to the existing technology, the present disclosure offers at least the following beneficial effects.

During the testing process, the front motor and rear motor are synchronously regulated through a precision controller, ensuring the rollers in the front and rear wheel testing units achieve a high degree of synchronization. This effectively addresses the issue of ESP alarms in electric vehicles. The integrated testing platform of this present disclosure, through the connection between the power battery testing equipment and the power battery management system of the electric vehicle, is able to read data from the individual cells within the vehicle's power battery pack, including voltage, current, temperature, as well as the SOC value of the battery pack. In response to the rapid operating conditions specified for electric vehicle performance testing, the integrated testing platform performs load force output control on the chassis dynamometer. Under specific testing conditions, it conducts a comprehensive evaluation of the overall power performance and economic performance of the electric vehicle. Due to the voltmeters, ammeters and temperature sensors, the total voltage, current and temperature of the power battery pack are monitored. The control system analyzes and calculates the detection data from various devices and instruments according to the developed testing methods for the power and economic performance of electric vehicles. Consequently, it evaluates the performance status of the battery system, electric drive system, and electronic control system of the electric vehicle.

DETAILED DESCRIPTION OF EMBODIMENTS

The present disclosure will be further described in detail below in conjunction with the accompanying drawings.

Figure 1:
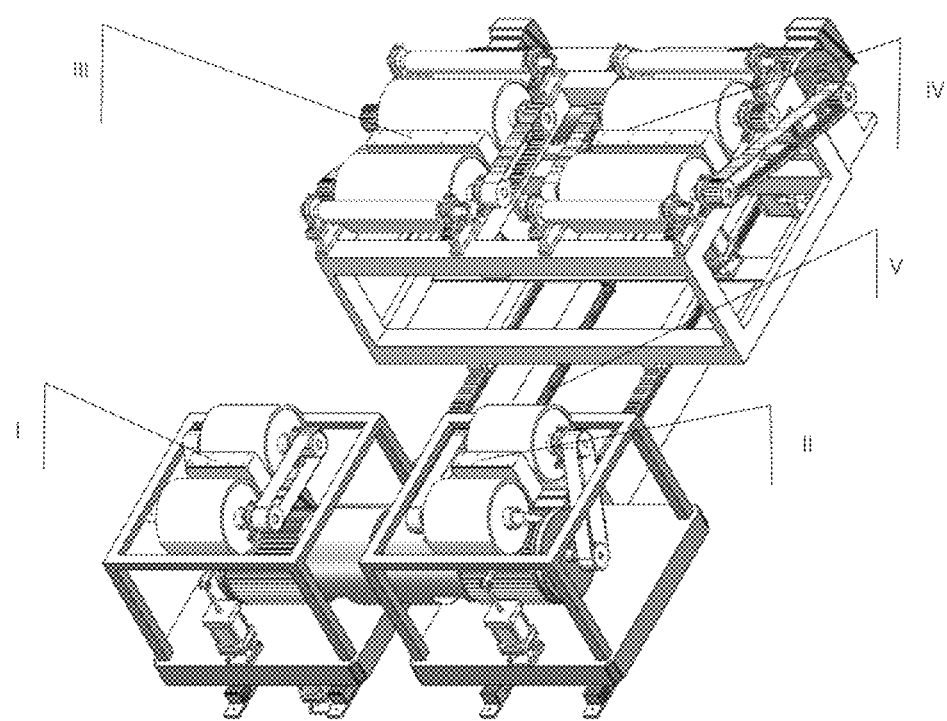
FIG. 1 is a structural diagram of the integrated testing platform for power battery, electric drive system and electronic control system of an electric vehicle based on synchronized control of the front and rear motors according to an embodiment of the present disclosure.
Figure 2:
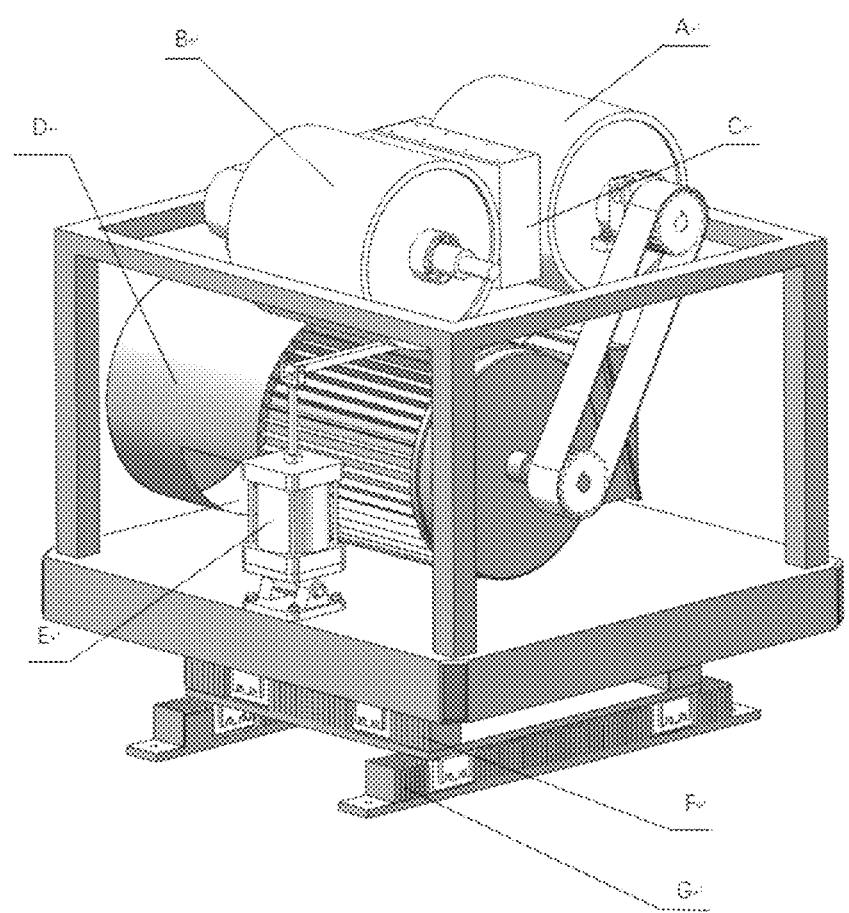
FIG. 2 is a structural diagram of the right-front-wheel testing unit of the integrated testing platform according to an embodiment of the present disclosure.
Figure 3:
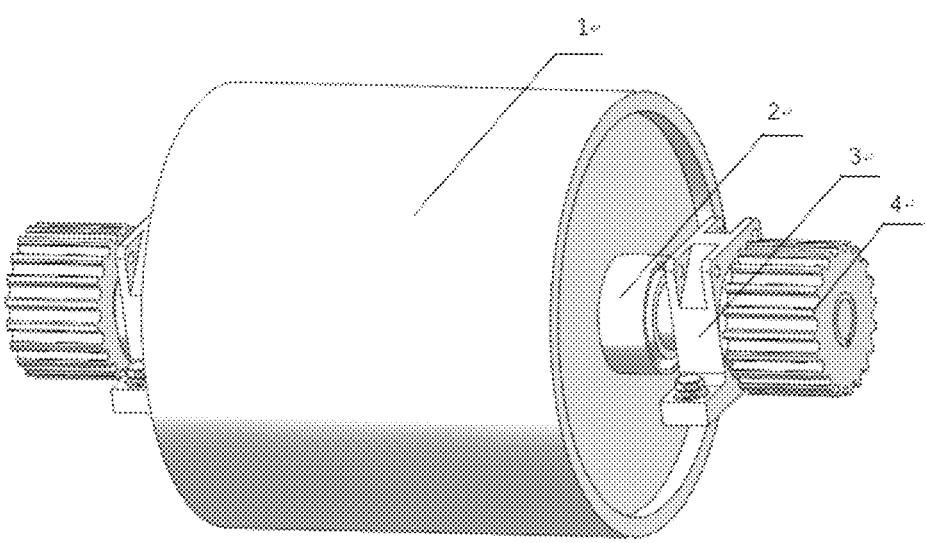
FIG. 3 is a structural diagram of the front driving roller mechanism of the right-front-wheel testing unit according to an embodiment of the present disclosure.

As shown in FIG. 1, an integrated testing platform for power battery, electric drive system and electronic control system of an electric vehicle based on synchronized control of front and rear motors provided herein, includes a right-front-wheel testing unit I, a left-front-wheel testing unit II, a right-rear-wheel testing unit III, a left-rear-wheel testing unit IV and a wheelbase adjustment device V.

Specifically, the right-front-wheel testing unit I is structurally identical to the left-front-wheel testing unit II, and the right-rear-wheel testing unit III is structurally identical to the left-rear-wheel testing unit IV. The right-front-wheel testing unit I, the left-front-wheel testing unit II, the right-rear-wheel testing unit III and the left-rear-wheel testing unit IV are provided at the same horizontal foundation plane. The right-front-wheel testing unit I and the left-front-wheel testing unit II are aligned and placed in parallel at the front of the integrated testing platform, and the right-rear-wheel testing unit III and the left-rear-wheel testing unit IV are aligned and placed in parallel at the rear of the integrated testing platform. The transverse centerline of the right-front-wheel testing unit I coincides with the transverse centerline of the left-front-wheel testing unit II. The transverse centerline of the right-rear-wheel testing unit III coincides with a transverse centerline of the left-rear-wheel testing unit IV. The wheelbase adjustment device is provided between the right-rear-wheel testing unit III and the left-rear-wheel testing unit IV. The transverse centerline of the wheelbase adjustment device coincides with the transverse centerline of the right-rear-wheel testing unit III and the transverse centerline of the left-rear-wheel testing unit IV.

As shown in FIGS. 2-5, each of the right-front-wheel testing unit I and the left-front-wheel testing unit II includes a front driving roller mechanism A, a front driven roller mechanism B, a front lifting device C and a front wheel motor D, a front lifting air pump E, a lateral rail F and a longitudinal rail G, a base of the front wheel motor H, a first gear I and a second gear J. The second gear J is larger than the first gear I. The front driving roller mechanism A and the front driven roller mechanism B are structurally identical. The front driving roller mechanism A is connected to the front driven roller mechanism B through a belt, such that the front driving roller mechanism A and the front driven roller mechanism B are synchronized in motion state. The front driving roller mechanism A is connected to the front wheel motor D, and driven by the front wheel motor D. The the front driving roller mechanism A is driven by the front wheel motor D. The front lifting device C is provided at the center between the front driving roller mechanism A and the front driven roller mechanism B. The lower end of the front lifting device C is connected to a front air pump E. The front air pump E is fixed on the base of the front wheel motor H. The front air pump e is aligned parallel to an edge of the base of the front wheel motor H. The first gear I engaged with the second gear J. The first gear I and the second gear J is provided below the base of the front wheel motor H. The lateral rail F is perpendicular to the longitudinal rail G and the longitudinal rail G is provided below the lateral rail F.

The front driving roller mechanism A includes a cylindrical roller 1, two bearings 2, two bearing seats 3, and two driving roller gears 4. The bearings 2 are provided along the central axis of the cylindrical roller 1, the sides of the bearings 2 fit the sides of the cylindrical roller 1. The sides of the bearing seats 3 fit the sides of the driving roller gears 4, and centers of the bearing seats 3 are provided at the central axis of the cylindrical roller 1. The front driving roller mechanism A has a symmetrical structure, with the bearings 2, bearing seats 3 and driving roller gears 4 arranged symmetrically on both sides of the cylindrical roller 1.

Figure 4:
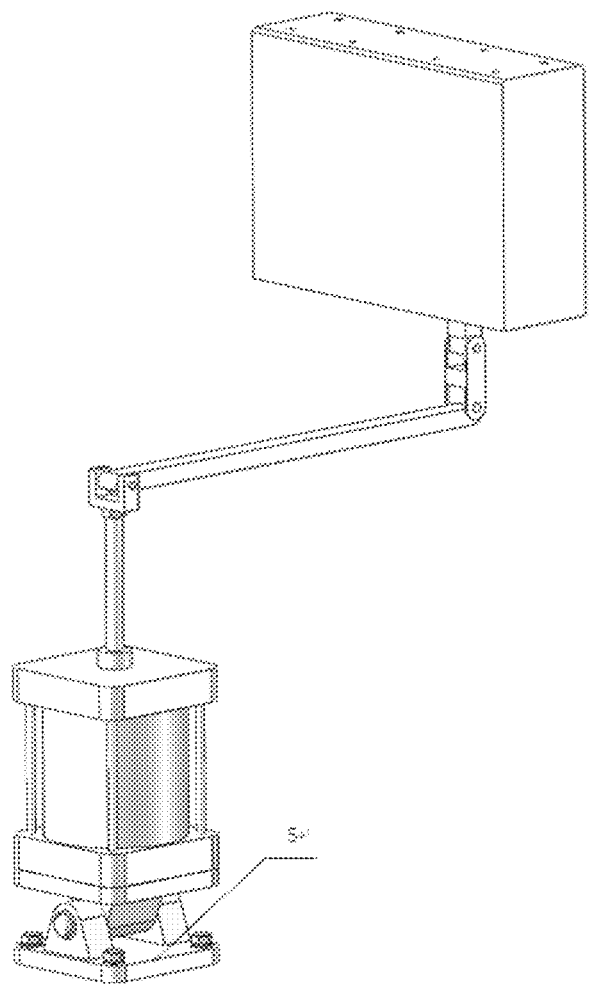
FIG. 4 is a structural diagram of the lifting air pump of the right-front-wheel testing unit according to an embodiment of the present disclosure.

The front lifting air pump E is fixed on the base of the front wheel motor H through an air pump base frame 5, as shown in FIG. 4. The air pump base frame 5 is secured to the base of the front wheel motor H by four symmetrically distributed bolts on its underside. The front lifting device C is connected to the upper end of the front lifting air pump E via three linkage mechanisms. The front lifting air pump E drives the front lifting device C to move up and down.

Figure 5:
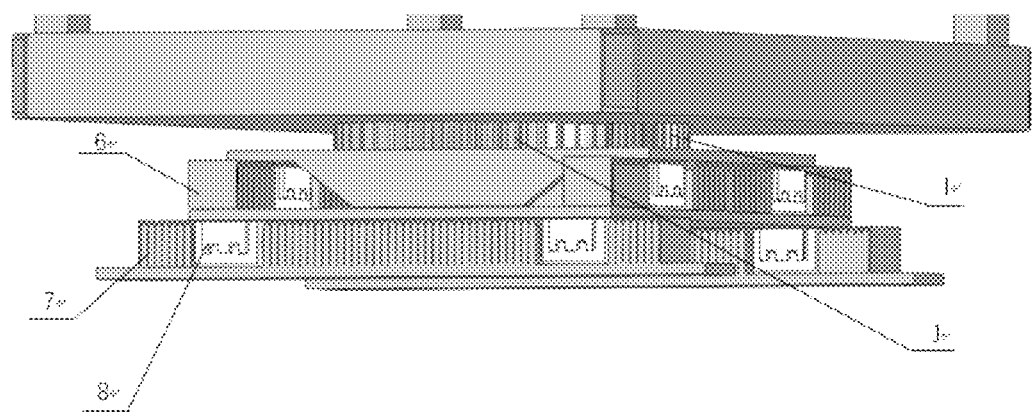
FIG. 5 is a structural diagram of the rail assembly of the right-front-wheel testing unit according to an embodiment of the present disclosure.

As shown in FIG. 5, the lateral rail F consists of two identical rail segments 6, which are symmetrically arranged on both sides of the base of the front wheel motor. Each rail segment is equipped with two rail fasteners 8, symmetrically arranged along the rail, and each rail segment's top end is fitted with baffles for blocking.

The longitudinal rail G consists of two identical rail segments 7. Each rail segment has two rail fasteners 8 symmetrically arranged, with baffles installed at the top end of each rail segment for blocking.

Figure 6:
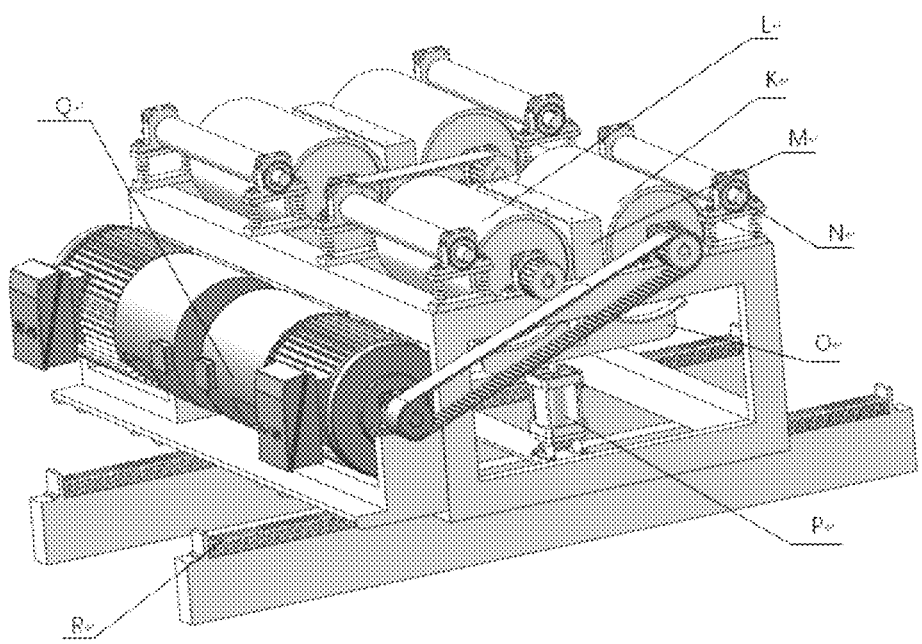
FIG. 6 is a structural diagram of the right-rear-wheel testing unit of the integrated testing platform according to an embodiment of the present disclosure.

As shown in FIG. 6, each of the right-rear-wheel testing unit III and the left-rear-wheel testing unit IV includes a rear driving roller mechanism K, a rear driven roller mechanism L, a rear lifting device M, a blocking device N, a locking mechanism O, a rear lifting air pump P, a rear wheel motor Q, and a rear rail R. The rear rail R is fixed to the lower frame of the frame assembly. The rear lifting air pump P is fixed at the middle of the middle frame of the frame assembly and is connected to the rear lifting device M via a linkage mechanism. The rear wheel motor Q is fixed on the left side of the middle frame of the frame assembly, and the rear wheel motor's gear is connected to the gear of the driving roller mechanism K through a belt. The gears on both sides of the rear driving roller mechanism K and the rear driven roller mechanism L are fixed to the upper frame of the frame assembly through bearing seats, with one side of the gears connected for transmission via a belt. The rear lifting device M is positioned between the rear driving roller mechanism K and the rear driven roller mechanism L. The side of the rear driving roller mechanism K away from the rear driven roller mechanism L and the side of the rear driven roller mechanism L away from the rear driving roller mechanism K are each provided with the locking mechanism O. The locking mechanism O is fixed to the upper layer of the frame assembly through bolts. The locking mechanism O is located on both sides of the rear lifting air pump P and is connected to the rear lifting device M via a linkage mechanism.

Figure 7:
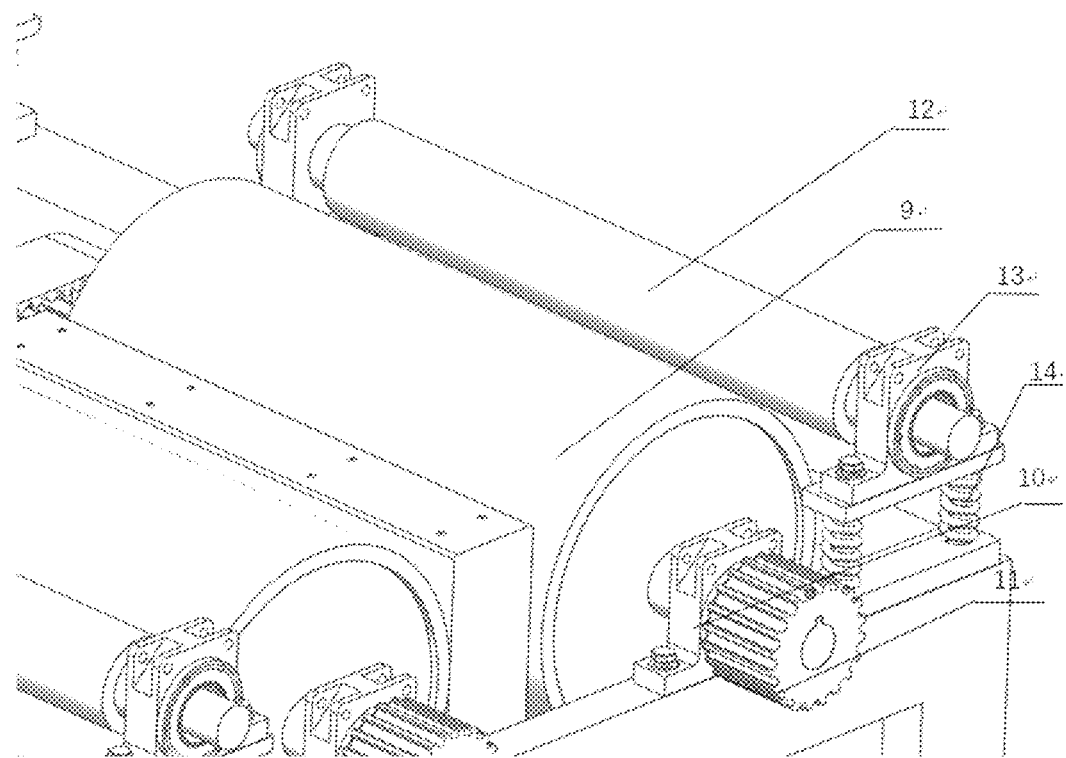
FIG. 7 is a structural diagram of the rear driving roller mechanism and the blocking device of the right-rear-wheel testing unit according to an embodiment of the present disclosure.

As shown in FIG. 7, the rear driving roller mechanism K includes a cylindrical roller 9, two bearing seats 10, and two gears 11. The bearing seats 10 are matched with the central axis of the cylindrical roller 9, and two bearing seats 10 are symmetrically mounted on both sides of the cylindrical roller 9 and are fixed to the frame assembly with bolts. The side surfaces of the bearing seats 10 fit to the side surfaces of the gears 11, and their centers align with the central axis of the cylindrical roller 9. The rear driving roller mechanism K has a symmetrical structure, with bearing seats 10 and gears 11 arranged symmetrically on both sides of the rear driving roller mechanism K.

The structure and installation method of the rear driven roller mechanism L are the same as those of the rear driving roller mechanism K. The gear on the left side of the rear driven roller mechanism L is connected through a belt to the gear of the rear driving roller mechanism K, ensuring that the rear driven roller mechanism L and rear driving roller mechanism K remain synchronized in motion state.

The blocking device N includes a cylindrical roller 12, two bearing seats 13, and two springs 14. The bearing seats 13 are symmetrically arranged on both sides of the cylindrical roller 12, with their centers aligned with the central axis of the cylindrical roller 12. The lower end of each of the bearing seats 13 is fixed to a metal plate using bolts, and the lower end of the metal plate is connected to two springs 14. The other ends of the springs 14 are fixed to the frame assembly.

Figure 8:
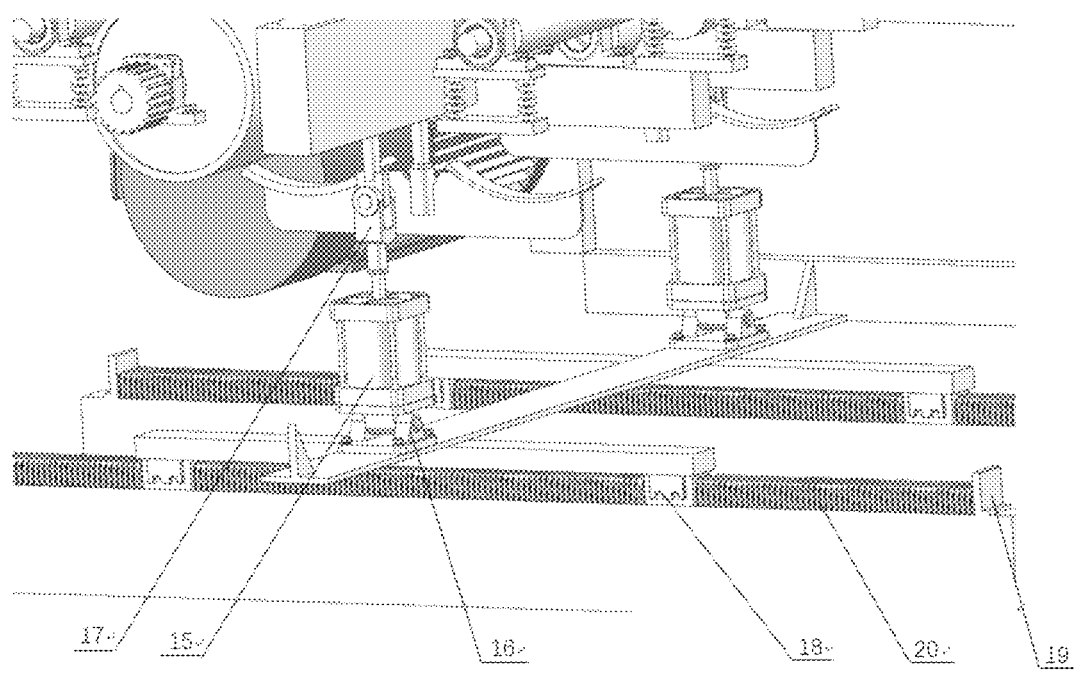
FIG. 8 is a structural diagram of the lifting air pump and the rail of the right-rear-wheel testing unit according to an embodiment of the present disclosure.

As shown in FIG. 8, the rear lifting air pump P includes an air pump body 15, an air pump base frame 16, and a linkage mechanism 17. The lower end of the air pump body 15 is connected to the air pump base frame 16. The air pump base frame 16 is fixed to the frame assembly with four bolts. The air pump body 15 is connected to the rear lifting device M via the linkage mechanism 17, driving the lifting block to move up and down.

The rear rail R includes of two rail fasteners 18, two rail baffles 19, and the rail segment 20. The rail fasteners 18 are respectively fixed at both ends of the base frame of the rear rail to drive the right-rear-wheel testing unit III and the left-rear-wheel testing unit IV to move along the rear rail. The two rail baffles 19 are respectively fixed at both ends of the rail segment 20.

Figure 9:
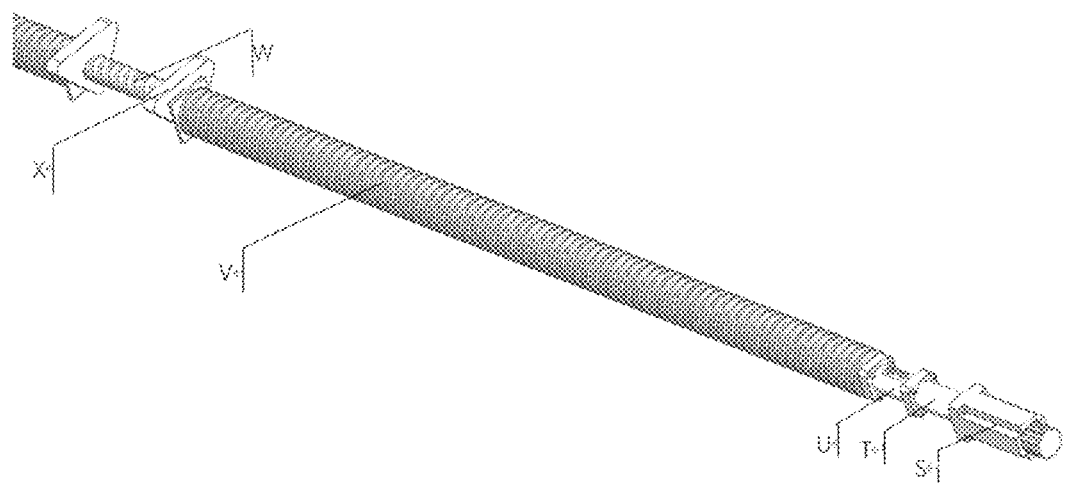
FIG. 9 is a structural diagram of the wheelbase adjustment device of the integrated testing platform according to an embodiment of the present disclosure.

As shown in FIG. 9, the wheelbase adjustment device V includes a wheelbase motor S, an intermediate shaft T, a coupling U, two screw rod protective covers V, a screw rod W, and two frame supports X. The upper end of one of the two frame supports X is fixed to a base frame of the right-rear-wheel testing unit III. The upper end of the other of the two frame supports X is fixed to a base frame of the left-rear-wheel testing unit IV The center of each of the two supports X is provided with a circular opening. The screw rod W is configured to pass through the circular opening. The screw rod protective cover V is configured to cover a part of the screw rod W between a first end of the screw rod W and one of the two supports X and a part of the screw rod W between a second end of the screw rod W and the other of the two supports X. Each of the first end and the second end of the screw rod W is boltedly fixed to the coupling U through four bolts. The intermediate shaft T is boltedly fixed to the end of the coupling U. The end of the intermediate shaft T is boltedly fixed to the wheelbase motor S through four bolts.

In the embodiments of this disclosure, the front motor D and rear motor Q of the integrated testing platform adopt a PID control algorithm for synchronous control with simulation verification. The method ensures dual-motor synchronization within 0.03 seconds and meets the requirements for rapid synchronization control. The PID control algorithm regulates control based on the deviation's Proportional (P), Integral (I), and Derivative (D) terms. The control parameters are adjusted independently, making it an effective method for calibrating the dynamic quality of continuous systems.

Figure 10:
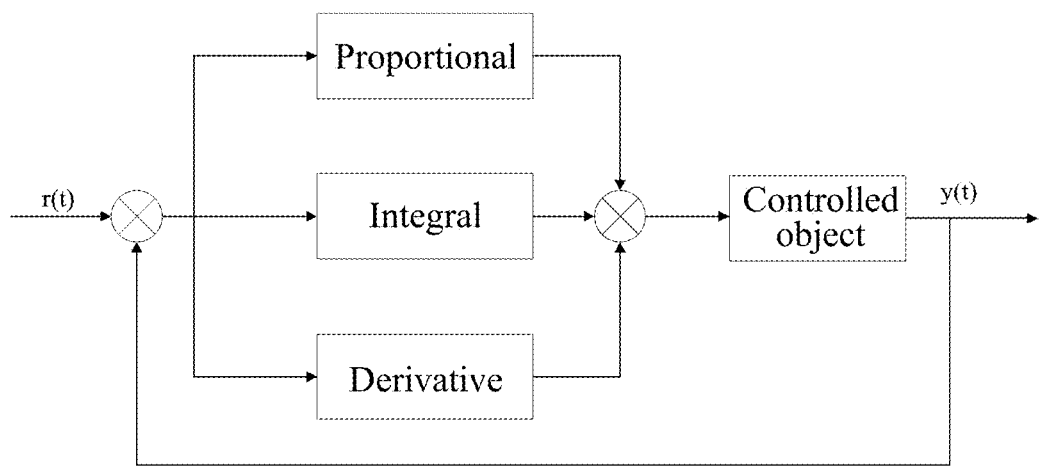
FIG. 10 is a structural diagram of the principle of the PID control algorithm used according to an embodiment of the present disclosure.

The PID algorithm mechanism used in this disclosure is illustrated in FIG. 10. r(t) represents the system's set value, y(t) represents the actual feedback output of the control system. The difference between them provides the error e(t) is expressed as:

$$e(t) = r(t) - y(t); \qquad (1)$$

The error signal e(t) is defined as the input to the PID controller, and the output u(t) is obtained using a combination of proportional, integral, and derivative terms. The formula for simulating PID computation is as follows:

$$u(t) = Kp\left(e(t) + \frac{1}{Ti}\int_0^t e(t)dt + T_d\frac{de(t)}{dt}\right); \qquad (2)$$

In the above formula, $K_p$ is the proportional constant, $T_i$ is the integral time constant, and $T_d$ is the derivative time constant.

Further, formula (2) is further discretized to meet application requirements. Sampling period T is taken, and at t=kTt, the discrete PID control formula is obtained as:

$$u(k) = Kp(e(k)) + \frac{T}{T_1}\sum_{j=0}^{k} e(j) + \frac{T_D}{T}(e(k) - e(k-1)); \qquad (3)$$

After simplifying formula (3), it becomes:

$$u(k) = K_p e(k) + K_1 \sum_{j=0}^{k} e(j) + K_D(e(k) - e(k-1)); \qquad (4)$$

In the above formula, $K_1$ is the integral coefficient, $K_d$ is the derivative coefficient, and e(k) and e(k−1) represent corresponding errors.

From formula (4), it is evident that the PID algorithm's output is correlated with the system's previous state. Accumulating e(k) significantly increases data processing complexity and should generally be avoided. If e(k) fluctuates during system instability, the output will change accordingly. Recursively applying formula (4) yields:

$$u(kT - T) = K_p e(kT - T) + K_1 \sum_{j=0}^{k-1} e(jT) + K_D[e(kT - T) - e(KT - 2T)] \tag{5}$$

Figure 11:
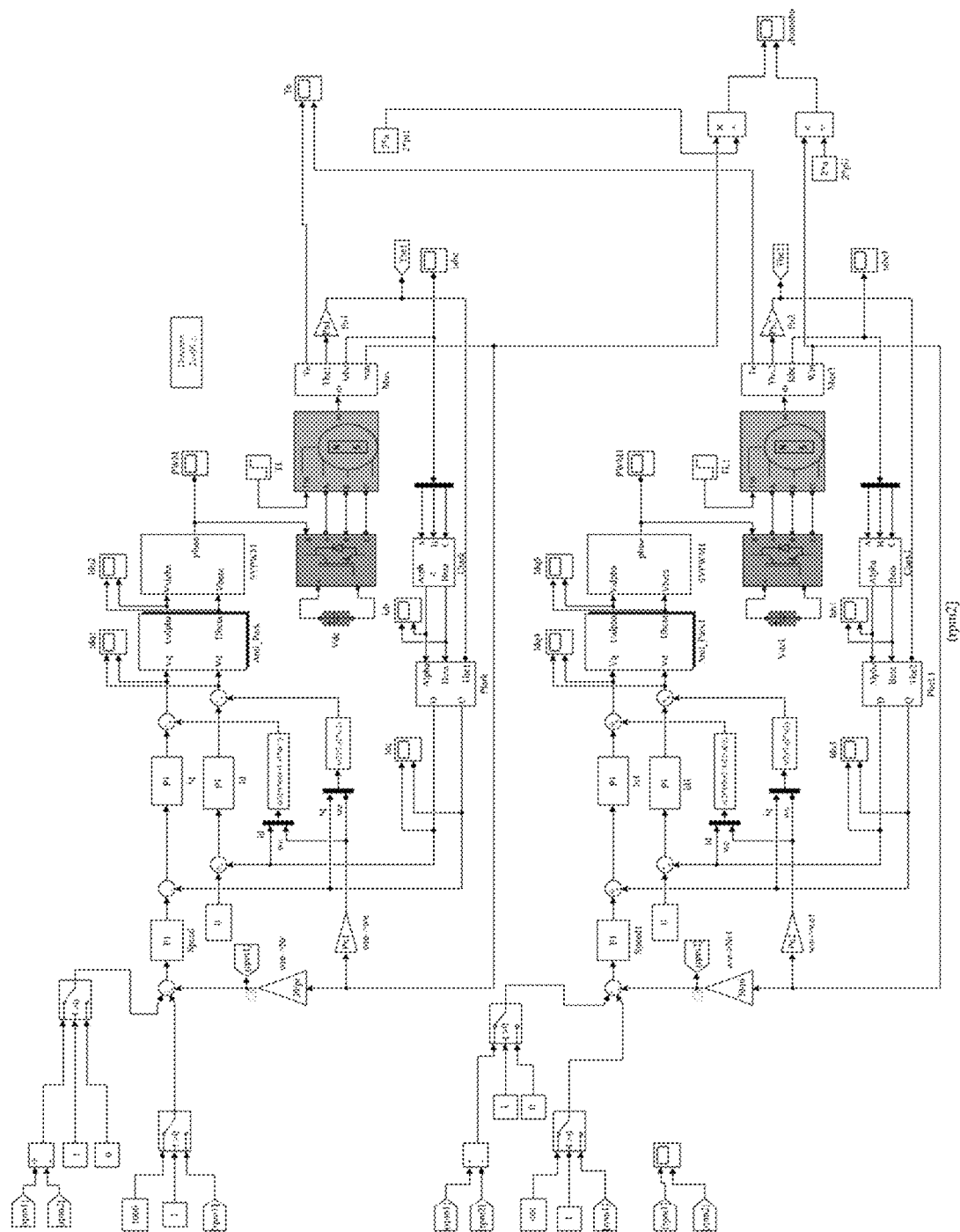
FIG. 11 is a structural diagram of the dual-motor control simulation model based on the PID control algorithm according to an embodiment of the present disclosure.

Using the above formulas, synchronous control of the front motor D and rear motor Q is performed. The simulation model is shown in FIG. 11.

Figure 12:
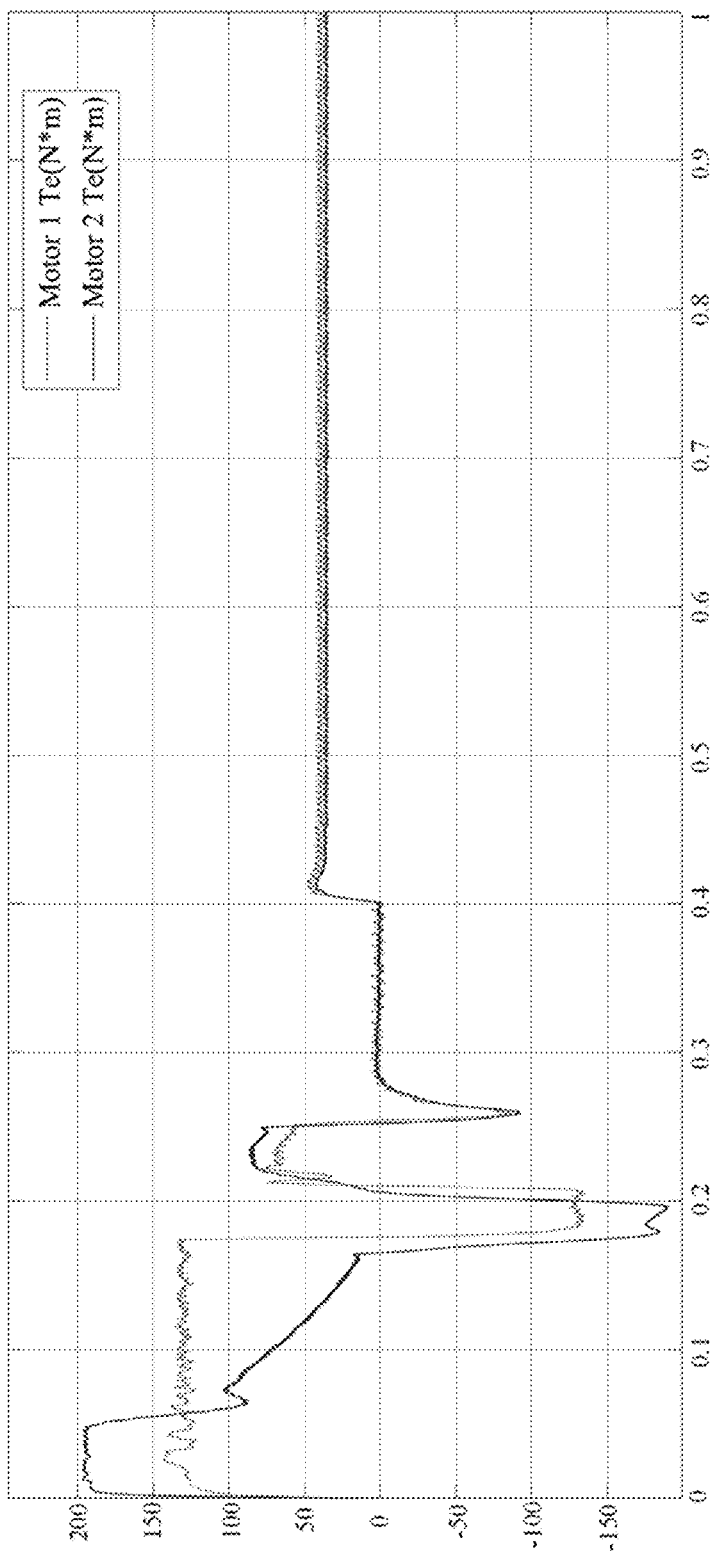
FIG. 12 shows the comparison between the torque outputs of the front and rear motors of the integrated testing platform according to an embodiment of the present disclosure.

FIG. 12 depicts the torque output comparison curve of the front motor D and rear motor Q during PID synchronous control simulation. At 0.4 seconds, after applying different loads to both motors, it is clear that PID achieves rapid dual-motor synchronization within 0.03 seconds, demonstrating excellent control performance.

Figure 13:
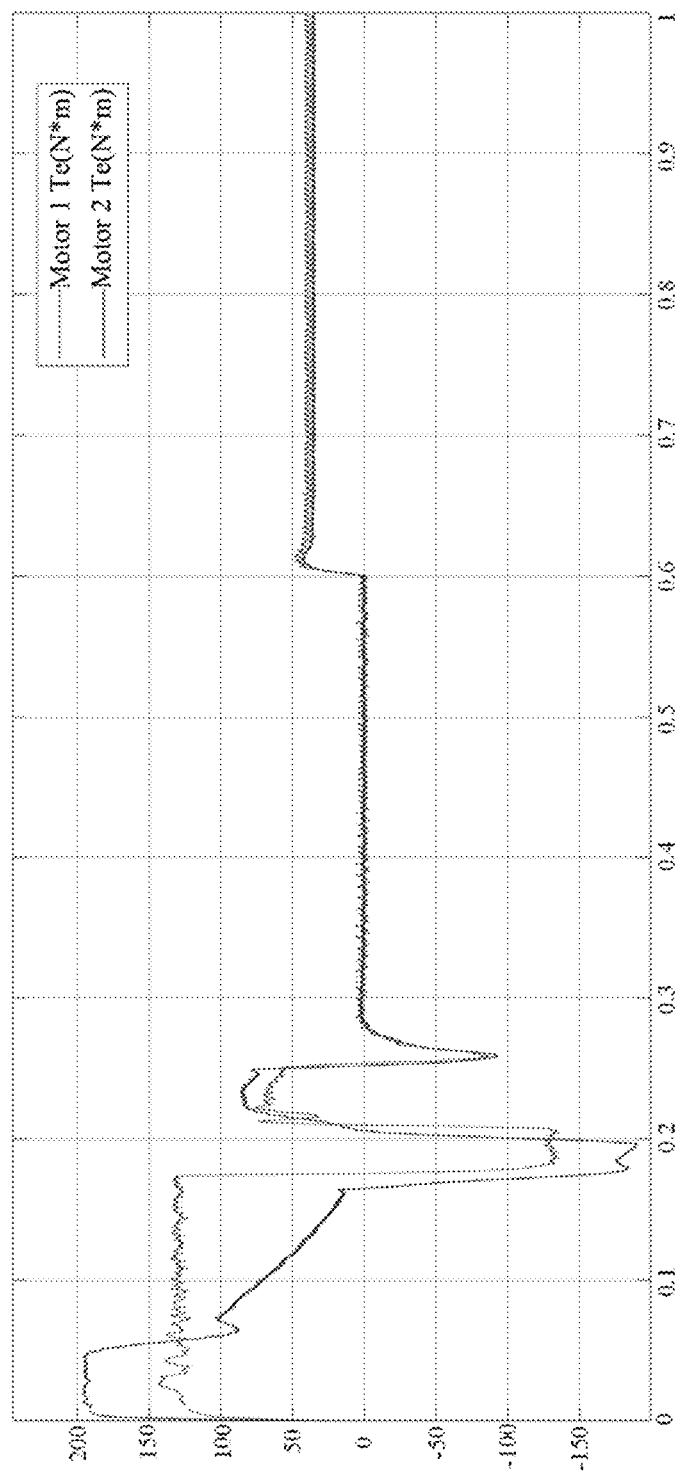
FIG. 13 shows the simulation results of the synchronous control of the front and rear motors of the integrated testing platform according to an embodiment of the present disclosure.

Based on the device's operational conditions, simulations were conducted using different loads and loading times for synchronous motor control. The simulation results, shown in FIG. 13, reflect that from 0 to 0.3 seconds, the front motor D and rear motor Q perform the transition from startup to synchronization. At 0.6 seconds, after applying different loads to the motors, the PID control system synchronizes the motors within 0.03 seconds.

Figure 14:
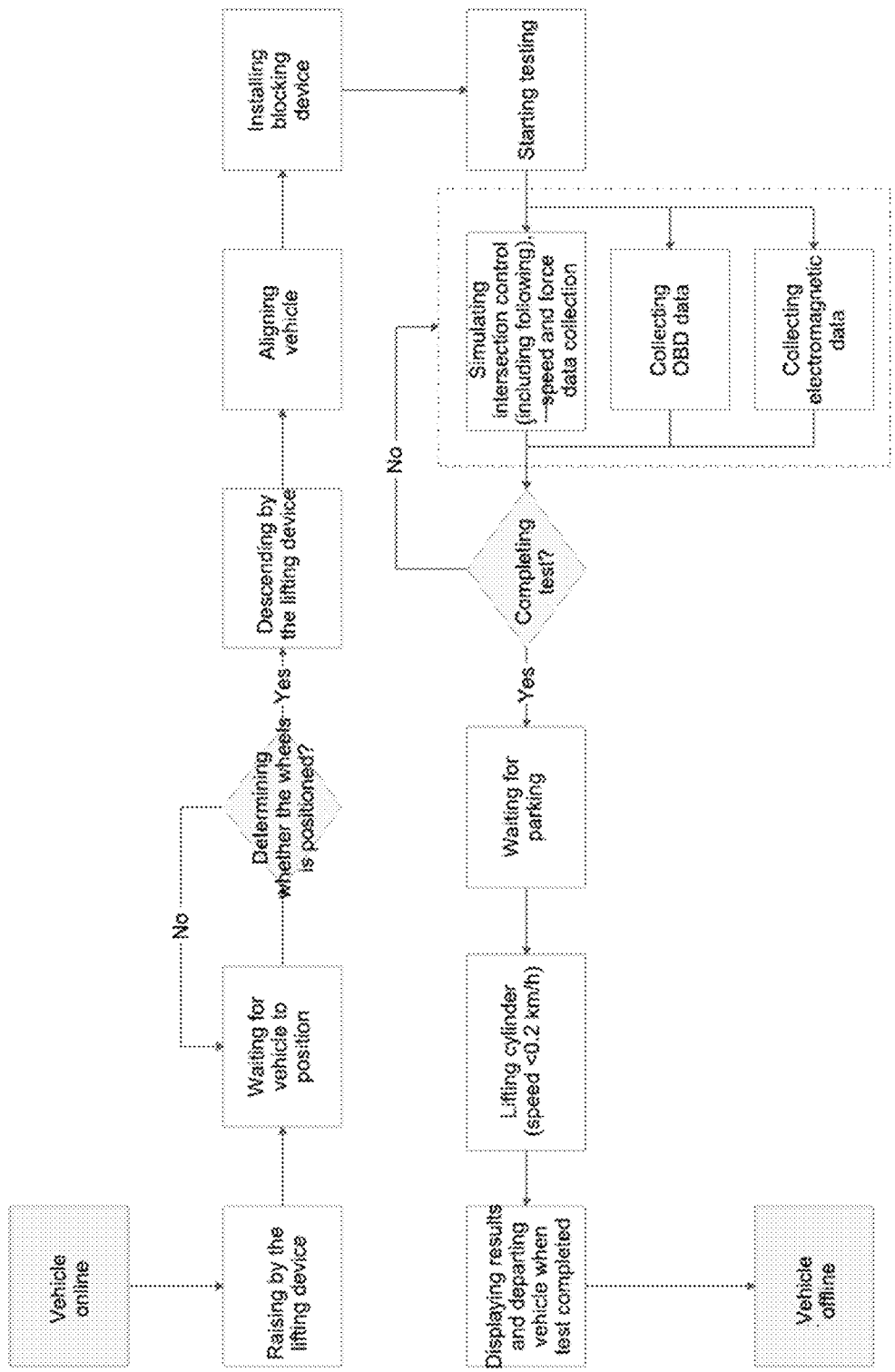
FIG. 14 is a flowchart of the online control process of the integrated testing platform according to an embodiment of the present disclosure.

The disclosure also provides a testing method for three-electric (power battery, electric drive system and electronic control system) of the electric vehicles, using the integrated testing platform for front and rear motor synchronization control. The overall online control process is detailed in FIG. 14. Before the to-be-tested electric vehicle enters the integrated testing platform for testing, a lifter is used to raise the vehicle, ensuring it can enter the integrated testing platform, and waits for the vehicle positioning signal. Once positioned, the integrated testing platform adjusts its wheelbase according to the vehicle's wheelbase information with millimeter precision and adapts the driving wheel's inertia. Subsequently, the to-be-tested electric vehicle is controlled according to standard operating conditions to complete the entire test process. During the coasting phase, no speed range control is applied, but during the subsequent acceleration, braking, and constant-speed phases, the to-be-tested electric vehicle must operate within ±3.0 km/h of the standard operating speed.

Throughout the operating conditions, real-time data is collected, including the vehicle's operating mode, the total voltage and current of the power battery, the highest and lowest voltage of individual cells, the highest and lowest temperatures, the real-time temperature of the motor, the controller, and the direct current to direct current (DC/DC) controller, the accelerator pedal position, brake pedal position, SOC, the motor's real-time torque, motor speed, vehicle real-time speed, and the loading force on the tire surface.

Before the test begins (before the to-be-tested electric vehicle enters the integrated testing platform), the operator inputs the test vehicle's wheelbase into the controller of the integrated testing platform. Using the wheelbase adjustment device V, the wheelbase motor drives the coupling to adjust the length of the screw rod, causing the support frames supporting the right-rear-wheel testing unit III and left-rear-wheel testing unit IV to move forward or backward along the rear rail. This ensures that the distance between the front and rear lifting device matches the wheelbase of the tested vehicle. The front and rear lifting devices are at their highest position, flush with the ground. The rollers at both ends of the blocking devices N lower to align with the height of the rear driving roller mechanism K and the rear driven roller mechanism L, allowing the to-be-tested electric vehicle to enter the integrated testing platform. After the to-be-tested electric vehicle enters the integrated testing platform and the front and rear wheels rest on the front and rear lifting devices between the driving roller mechanism and the driven roller mechanism, the rollers at both ends of the blocking device N rise to their highest position to ensure that the to-be-tested electric vehicle does not exit the device during the testing process. Subsequently, the front and rear lifting devices slowly lower to their lowest positions, suspending the wheels between the driving roller mechanism and the driven roller mechanism.

During the testing process, the operator adjusts the output load of the chassis dynamometer according to the requirements of the electric vehicle performance test. This simulates the load experienced by the electric vehicle on the integrated testing platform under various road conditions. By utilizing various sensors on the integrated testing platform and specialized detection equipment connected to the electric vehicle's battery management system, data such as the voltage, current, temperature of individual cells in the power battery pack, and the SOC of the power battery pack are recorded.

After the testis completed, the front and rear lifting devices slowly rise to their highest position, flush with the ground. The rollers at both ends of the blocking device N slowly lower, allowing the to-be-tested electric vehicle to exit the integrated testing platform after the testing process is complete.

Figure 15:
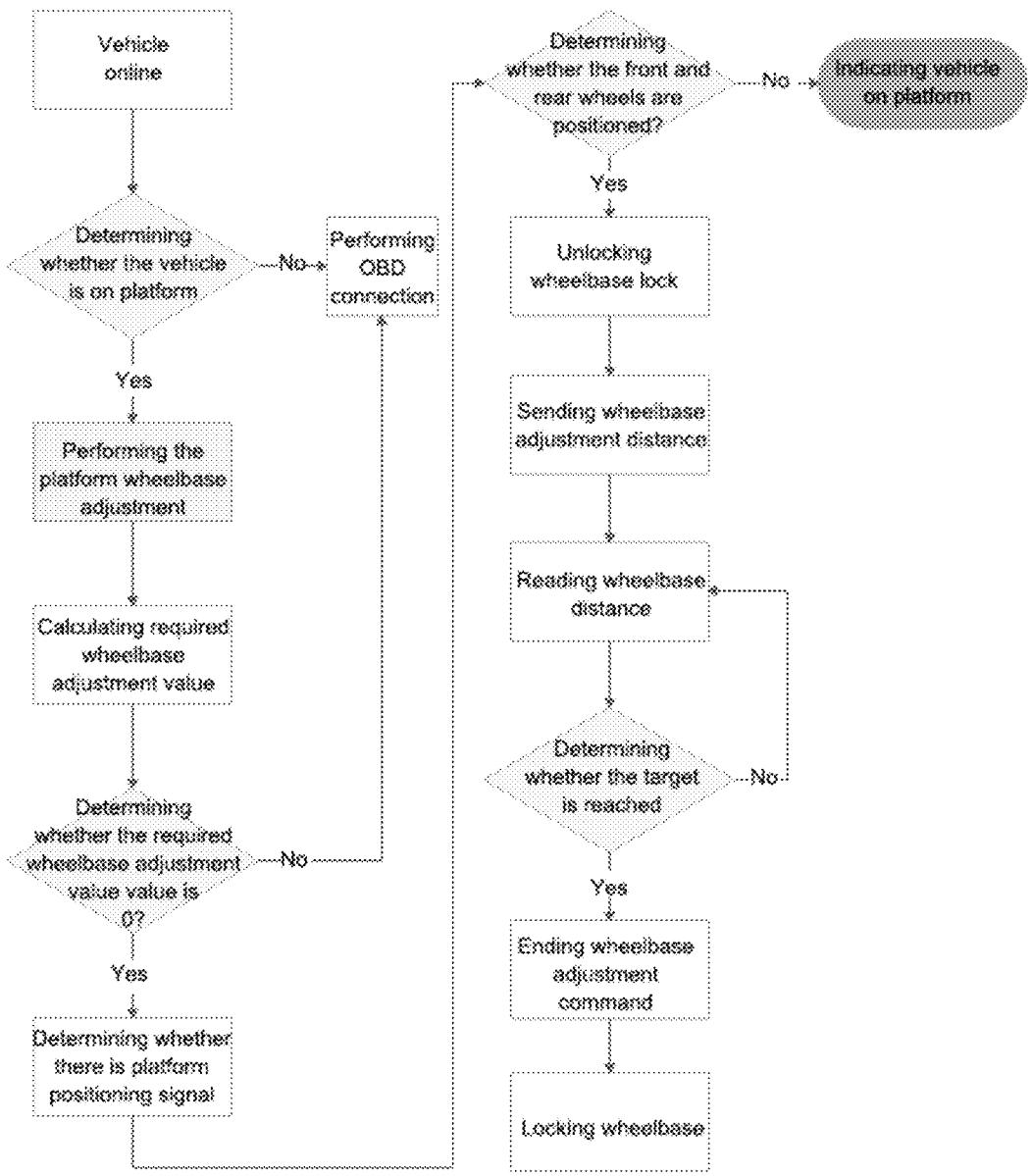
FIG. 15 is a flowchart of the wheelbase adjustment control process of the integrated testing platform according to an embodiment of the present disclosure.

The integrated testing platform for the three electric systems of electric vehicles is equipped with a wheelbase adjustment function. The process is shown in FIG. 15. Before the to-be-tested electric vehicle is loaded onto the integrated testing platform, the front of the integrated testing platform moves forward or backward based on the wheelbase information of the vehicle to be tested. This ensures that both axles of the vehicle to be tested can be positioned on the integrated testing platform. Simultaneously, preparation work for the test is carried out during the wheelbase adjustment process, thereby reducing the overall testing time. The connection of on-board diagnostics (OBD) equipment is performed in parallel. The wheelbase adjustment process calculates the difference between the current distance of the two platforms and the vehicle's wheelbase. A control command specifying the adjustment distance is issued to the wheelbase adjustment servo. During the adjustment, the system checks whether the target wheelbase value has been reached and ensures that the adjustment remains within the maximum and minimum limits of the wheelbase range. This prevents any dangerous situations from occurring during the adjustment process. Additionally, indicator lights are used during the adjustment process to alert personnel that the platforms are in motion.

Figure 16:
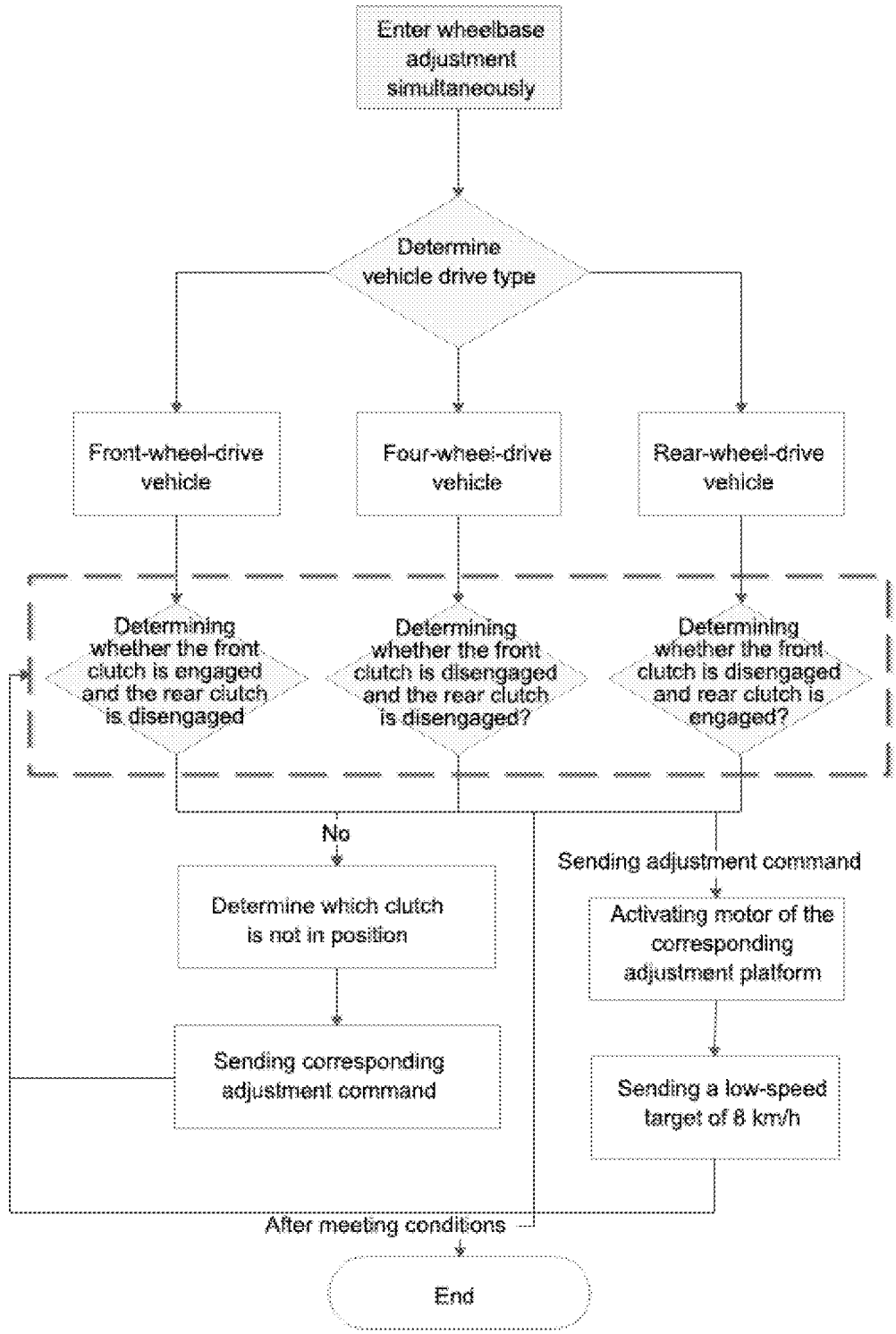
FIG. 16 is a flowchart of the inertia switching control process of the integrated testing platform according to an embodiment of the present disclosure.

Specifically, the inertia selection function is a sub-function of the testing process, with the detection workflow shown in FIG. 16. To simulate the inertia of the vehicle during road driving and to accommodate vehicles of different weights for testing, the inertia selection is switched based on the parking position of the drive wheels. At the same time, necessary safety checks are performed during the control process to ensure protection.

In the description of the present disclosure, it is to be understood that the orientation or positional relationships indicated by terms "top", "bottom", "inside", and "outside", etc. are based on those shown in the accompanying drawings. These terms are only for the purpose of facilitating and simplifying the description of the present disclosure, instead of indicating or implying that the device or element referred to must have a particular orientation, be constructed and operated in a particular orientation. In the present disclosure, unless otherwise expressly specified and limited, the terms "install", "attach", "connect", "fix" and the like shall be interpreted in a broad sense. For example, it can be fixed connection, removable connection, or integral connection; mechanical connection or electrical connection; direct connection or indirect connection through an intermediate medium; or internal communication or interaction between two elements. For those skilled in the art, the specific meanings of the above terms in the present disclosure may be understood on a box-by-case basis.

It should be noted that the disclosed embodiments are merely exemplary, and are not limited to limit the present disclosure. It should be understood, for those skilled in the art, that those changes, modifications and replacements made without departing from the spirit of the disclosure shall fall within the scope of the disclosure defined by the appended claims.

What is claimed is:

1. An integrated testing platform for power battery, electric drive system and electronic control system of an electric vehicle based on synchronized control of front and rear motors, comprising:
    a first testing unit;
    a second testing unit;
    a third testing unit;
    a fourth testing unit; and
    a wheelbase adjustment device;
    wherein the first testing unit is configured to test a first front wheel of the electric vehicle; the second testing unit is configured to test a second front wheel of the electric vehicle; the third testing unit is configured to test a first rear wheel of the electric vehicle; and the fourth testing unit is configured to test a second rear wheel of the electric vehicle; the first testing unit is structurally identical to the second testing unit; the third testing unit is structurally identical to the fourth testing unit; the first testing unit, the second testing unit, the third testing unit and the fourth testing unit are provided at the same horizontal foundation plane;
    a transverse centerline of the first testing unit coincides with a transverse centerline of the second testing unit; a transverse centerline of the third testing unit coincides with a transverse centerline of the fourth testing unit; the wheelbase adjustment device is provided between the third testing unit and the fourth testing unit; and a transverse centerline of the wheelbase adjustment device coincides with the transverse centerline of the third testing unit and the transverse centerline of the fourth testing unit;
    each of the first testing unit and the second testing unit comprises a first driving roller mechanism, a first driven roller mechanism, a first lifting device and a first motor; the first driving roller mechanism and the first driven roller mechanism are configured to keep synchronized in motion state; the first driving roller mechanism is connected to the first motor, and is configured to be driven by the first motor; the first lifting device is configured to lift and lower the first driving roller mechanism and the first driven roller mechanism; the first testing unit and the second testing unit are each provided on a base of the first motor; the base of the first motor is provided on a rail assembly; and the rail assembly comprises a lateral rail and a longitudinal rail;
    each of the third testing unit and the fourth testing unit comprises a second driving roller mechanism, a second driven roller mechanism, a second lifting device, a blocking device, a locking mechanism and a second motor; the second driving roller mechanism and the second driven roller mechanism are configured to keep synchronized in motion state; the second driving roller mechanism is connected to the second motor, and is configured to be driven by the second motor; the second lifting device is configured to lift and lower the second driving roller mechanism and the second driven roller mechanism; the blocking device is configured to prevent the first rear wheel and the second rear wheel from exiting a testing position during a testing process; the locking mechanism is configured to lock the second driving roller mechanism and the second driven roller mechanism; the locking mechanism is connected to the second lifting device through a first linkage mechanism; the third testing unit and the fourth testing unit are each provided on a frame assembly; a bottom of the frame assembly is provided on a rear rail; and the rear rail is linked with the rail assembly;
    the wheelbase adjustment device is configured to adjust a distance between the base of the first motor and the frame assembly;
    the first motor and the second motor are configured to be synchronously controlled by a controller during the testing process;
    the first driving roller mechanism is structurally identical to the first driven roller mechanism; a first end of the first driving roller mechanism is connected to a first end of the first driven roller mechanism through a first belt, such that the first driving roller mechanism and the first driven roller mechanism are synchronized in the motion state; a second end of the first driving roller mechanism is provided with a first gear; a side of the first motor is provided with a second gear; the first gear is connected to the second gear through a second belt, such that the first driving roller mechanism is driven by the first motor; the first lifting device is provided at a center between the first driving roller mechanism and the first driven roller mechanism; a lower end of the first lifting device is connected to a first air pump through a second linkage mechanism; the first air pump is fixed on the base of the first motor; the first air pump is parallel to an edge of the base of the first motor; the lateral rail is perpendicular to the longitudinal rail; and the longitudinal rail is provided below the lateral rail; and
    the first driving roller mechanism has a symmetrical structure, and comprises a first cylindrical roller, a bearing, a first bearing seat and the first gear; the bearing is provided along a central axis of the first cylindrical roller; a side of the bearing is configured to fit a side of the first cylindrical roller; a side of the first bearing seat is configured to fit a side of the first gear; centers of the first bearing seat and the first gear are located at the central axis of the first cylindrical roller; and two opposite sides of the first cylindrical roller are each provided with the bearing, the first bearing seat and the first gear through the same mounting manner.

2. The integrated testing platform of claim 1, wherein the first testing unit and the second testing unit each further comprise the first air pump; the first air pump is fixed on the base of the first motor through a first base frame; and the first lifting device is connected to an upper end of the first air pump via the second linkage mechanism, and is configured to be driven by the first air pump to move up and down; and each of the third testing unit and the fourth testing unit further comprises a second air pump; the second air pump comprises a pump body, a second base frame and a third linkage mechanism; a lower end of the pump body is connected to the second base frame; the second base frame is boltedly fixed to the frame assembly; and the pump body is connected to the second lifting device via the third linkage mechanism, and is configured to drive the second lifting device to ascend and descend.

3. The integrated testing platform of claim 1, wherein the lateral rail comprises two first rail segments; the two first rail segments are structurally identical, and are symmetrically provided on both sides of the base of the first motor; each of the two first rail segments is symmetrically provided with two first fasteners; a top end of each of the two first rail segments is provided with a first baffle for blocking;

the longitudinal rail comprises two second rail segments; the two second rail segments are structurally identical; each of the two second rail segments is symmetrically provided with two second fasteners; and a top end of each of the two second rail segments is provided with a second baffle for blocking; and the rear rail comprises a third fastener, a third baffle, and a third rail segment; two ends of a base frame of the rear rail are each fixedly provided with the third fastener to drive the third testing unit and the fourth testing unit to move along the rear rail; and two ends of the third rail segment are each fixedly provided with the third baffle.

4. The integrated testing platform of claim 1, wherein the frame assembly comprises:
a lower frame;
a middle frame; and
an upper frame;
wherein each of the third testing unit and the fourth testing unit further comprises a second air pump; the rear rail is fixed to the lower frame; the second air pump is fixed at a middle of the middle frame, and is connected to the second lifting device via a third linkage mechanism; the second motor is fixed to a side of the middle frame; the second motor is provided with a third gear; two sides of the second driving roller mechanism are respectively provided with a fourth gear and a fifth gear; the third gear is connected to the fourth gear via a third belt; two sides of the second driven roller mechanism are respectively provided with a sixth gear and a seventh gear; the fourth gear and the fifth gear are each fixed to the upper frame through a second bearing seat; the sixth gear and the seventh gear are each fixed to the upper frame through a third bearing seat; the fifth gear is connected to the sixth gear via a fourth belt for transmission;

the second lifting device is provided between the second driving roller mechanism and the second driven roller mechanism; a side of the second driving roller mechanism away from the second driven roller mechanism and a side of the second driven roller mechanism away from the second driving roller mechanism are each provided with the blocking device; the locking mechanism is boltedly fixed to the upper frame; and the locking mechanism is provided on both sides of the air pump, and is connected to the second lifting device via the first linkage mechanism.

5. The integrated testing platform of claim 4, wherein the second driving roller mechanism comprises:
a second cylindrical roller;
two second bearing seats;
the fourth gear; and
the fifth gear;
wherein a central axis of each of the two second bearing seats coincides with a central axis of the second cylindrical roller; the two second bearing seats are symmetrically provided on both sides of the second cylindrical roller; side surfaces of the two second bearing seats are respectively configured to fit a side of the fourth gear and a side of the fifth gear; a central axis of the fourth gear and a central axis of the fifth gear coincide with the central axis of the second cylindrical roller; the second driving roller mechanism has a symmetrical structure; the fourth gear and the fifth gear are symmetrically provided on both sides of the second cylindrical roller; and the second driven roller mechanism is structurally identical to the second driving roller mechanism; the second driving roller mechanism and the second driven roller mechanism are structurally identical.

6. The integrated testing platform of claim 4, wherein the blocking device comprises:
a second cylindrical roller;
two fourth bearing seats; and
a spring;
wherein the two fourth bearing seats are symmetrically arranged on both sides of the second cylindrical roller; a center of each of the two fourth bearing seats is located on a center axis of the second cylindrical roller; a lower end of each of the two fourth bearing seats is boltedly fixed to a support plate; a lower surface of the support plate is connected to a first end of the spring; and a second end of the spring is fixed to the frame assembly.

7. The integrated testing platform of claim 1, wherein the wheelbase adjustment device comprises:
a third motor;
an intermediate shaft;
a coupling;
a protective cover;
a screw rod; and
two supports;
wherein an upper end of one of the two supports is fixed to a lower side of a base frame of the third testing unit; an upper end of the other of the two supports is fixed to a lower side of a base frame of the fourth testing unit; a center of each of the two supports is provided with a circular opening; the screw rod is configured to pass through the circular opening; the protective cover is configured to cover a part of the screw rod between a first end of the screw rod and one of the two supports and a part of the screw rod between a second end of the screw rod and the other of the two supports; the first end and the second end of the screw rod are each boltedly fixed to the coupling; the intermediate shaft is boltedly fixed to an end of the coupling; and an end of the intermediate shaft is boltedly fixed to the third motor.

8. A testing method using the integrated testing platform of claim 1, comprising:

before testing, moving, by the wheelbase adjustment device, the frame assembly supporting the third testing unit and the fourth testing unit forward or backward along the rear rail based on a wheelbase of a to-be-tested electric vehicle to allow a distance between the first testing unit and the third testing unit and a distance between the second testing unit and the fourth testing unit to match the wheelbase of the to-be-tested electric vehicle; raising the first lifting device and the second lifting device such that an upper end of each of the first lifting device and the second lifting device is flush with a ground; lowering the blocking device to align with a height of each of the second driving roller mechanism and the second driven roller mechanism; driving the to-be-tested electric vehicle to the integrated testing platform; raising the blocking device to prevent the first rear wheel and the second rear wheel from exiting the testing position during the testing process; and lowing the first lifting device and the second lifting device to allow the first front wheel, the second front wheel, the first rear wheel and the second rear wheel to be respectively suspended between the first driving roller mechanism and the first driven roller mechanism of the first testing unit, between the first driving roller mechanism and the first driven roller mechanism of the second testing unit, between the second driving roller mechanism and the second driven roller mechanism of the third testing unit, and between the second driving roller mechanism and the second driven roller mechanism of the fourth testing unit; and during the testing process, synchronously controlling the first motor and the second motor using a proportional-integral-derivative (PID) control algorithm; simulating loads under road driving conditions according to a performance testing requirement of the to-be-tested electric vehicle; and measuring a voltage, a current, and a temperature of individual cells within a power battery pack of the to-be-tested electric vehicle, as well as a state-of-charge (SOC) value of the power battery pack to evaluate a performance state of a power battery, an electric drive system and an electronic control system of the to-be-tested electric vehicle.

* * * * *